United States Patent
Moessinger et al.

(10) Patent No.: US 6,319,012 B1
(45) Date of Patent: Nov. 20, 2001

(54) FLEXIBLE CONDUCTIVE TAPE CONNECTION

(75) Inventors: Juergen Moessinger, Weinsberg-Wimmental; Walter Grote, Markgroeningen, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/230,019

(22) PCT Filed: Aug. 8, 1997

(86) PCT No.: PCT/DE97/01675
§ 371 Date: Jan. 18, 1999
§ 102(e) Date: Jan. 18, 1999

(87) PCT Pub. No.: WO98/12902
PCT Pub. Date: Mar. 26, 1998

(30) Foreign Application Priority Data

Sep. 16, 1996 (DE) ............................................. 196 37 626

(51) Int. Cl.[7] .................................................. H01R 41/00
(52) U.S. Cl. .............................. 439/33; 439/66; 439/492; 174/69; 191/12 R
(58) Field of Search .................... 439/66, 67, 492, 439/495, 936, 32, 33; 174/69; 191/12 R

(56) References Cited

U.S. PATENT DOCUMENTS

| | | | |
|---|---|---|---|
| 3,736,396 | * 5/1973 | Siegel | 200/166 |
| 4,703,649 | 11/1987 | Eitoku et al. | |
| 4,800,461 | 1/1989 | Dixon et al. | |
| 4,818,823 | * 4/1989 | Bradley | 174/68.5 |
| 5,198,391 | 3/1993 | Roesel et al. | |
| 5,358,412 | * 10/1994 | Maurinus et al. | 439/66 |
| 5,395,253 | * 3/1995 | Crumly | 439/67 |
| 5,481,795 | 1/1996 | Hatakeyama et al. | |
| 5,518,415 | * 5/1996 | Sand | 439/204 |
| 5,563,521 | * 10/1996 | Crumly | 324/757 |
| 5,742,484 | * 4/1998 | Gillette et al. | 361/789 |

FOREIGN PATENT DOCUMENTS

| | | |
|---|---|---|
| 40 38 394.6 | 12/1990 | (DE) . |
| 42 29 727 A1 | 3/1994 | (DE) . |
| 43 25 980 A1 | 2/1995 | (DE) . |

OTHER PUBLICATIONS

De–Prospekt Der Fa. Adapt Elektronik Programmuebersicht 84/85 (Elektronika 1984).
Special Report Designer Must Plan Early For Flat Cable, Electronic/Jul. 5, 1973, pp. 84–88.

* cited by examiner

Primary Examiner—Paula Bradley
Assistant Examiner—Truc Nguyen
(74) Attorney, Agent, or Firm—Michael J. Striker

(57) ABSTRACT

The invention relates to a flexible strip conductor connection, by means of which electrical connections between an electrical device (2) and an external component (1) can be made, wherein the strip conductors (8) are located in or on a flexible foil (3), which is clamped on the electrical device (2) as well as the external component (1). In a predetermined area in the course of the strip conductors (8), the flexible foil (3) has a loop (6), which can be filled with an elastic material perpendicularly in relation to the foil plane, or the strip conductors (8) in the plane of the foil respectively have a loop-shaped deviation (9) perpendicularly to the course of strip conductor.

14 Claims, 2 Drawing Sheets

FLEXIBLE CONDUCTIVE TAPE CONNECTION

PRIOR ART

The invention relates to a flexible strip conductor connection, in particular for a control or regulating device having a set-off sensor or servo component, in accordance with the preamble of claim 1.

In a flexible strip conductor connection known from DE 40 38 394 A1, an electrical connection is provided between a control arrangement for a magnetic valve in a motor vehicle and an angle sensor for detecting the angle of rotation of a fuel injection pump. The angle sensor is supplied with an electrical voltage by means of the strip conductors placed into a flexible foil and emits a sensor signal to the control device.

With the known angle sensor, the flexible foil is clamped between the cover and the housing so that when the unit, on which the angle sensor is fastened, is operated, mechanical vibrations are transmitted to the flexible foil. For example, if the angle sensor is employed on the pump shaft of a fuel injection pump of a motor vehicle, there is the possibility of shocks, which are a function of the number of cylinders in particular, being transmitted to the flexible foil. The number of shocks here is a function of the number of cylinders of the internal combustion engine. These relatively frequent and short shocks can lead to breakage of the strip conductors in the foil, mainly at the clamping location of the flexible foil between the cover and the housing of the angle sensor, and therefore to error functions.

ADVANTAGES OF THE INVENTION

In the further development with the characterizing features of claim 1, the flexible strip conductor connections of the type described at the outset is advantageous in that a buffer for the mechanical shocks is created by the loop in the flexible foil, or respectively in the strip conductors. A change in the length of the foil and the strip conductors of a size between 0 and 300 μm is caused by the shocks transmitted to the flexible foil. The installation of the loops in accordance with the invention here results in a reduction of the expansions caused by the shocks and of the mechanical stress in the strip conductors and the flexible foil.

This reduction in the stretching of the strip conductors in the course of the individual shocks, which is also successfully provided in the further developments in the dependent claims, increases the long-time service life of the strip conductors, so that the loss of the sensors as an external component because of a break in the strip conductors in the flexible foil is prevented to a large extent during the length of operation of the arrangement.

DRAWINGS

Figure 1:
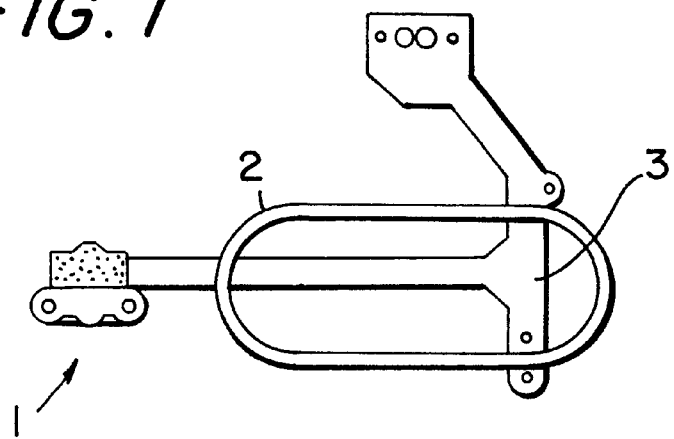
Figure 2:
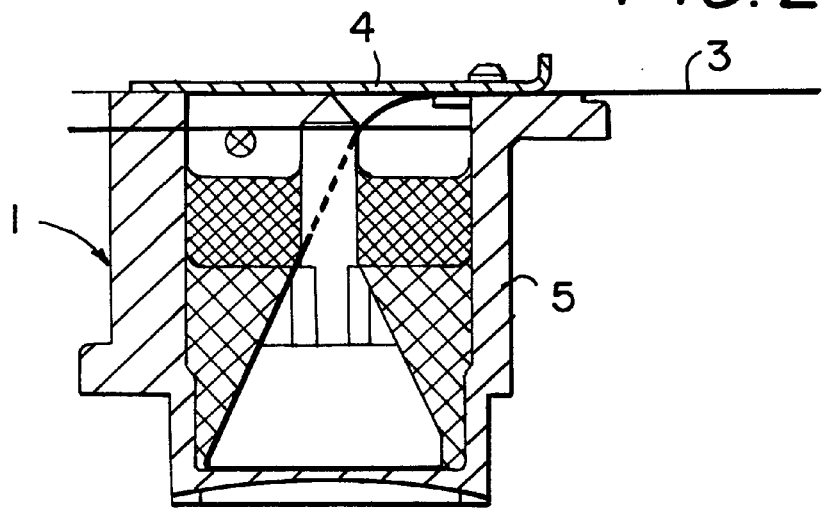
Figure 3:
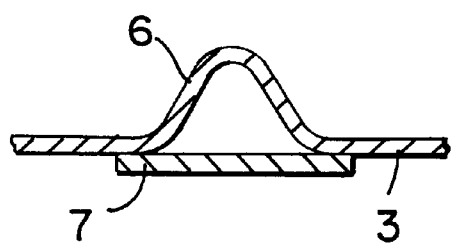
Figure 4A:
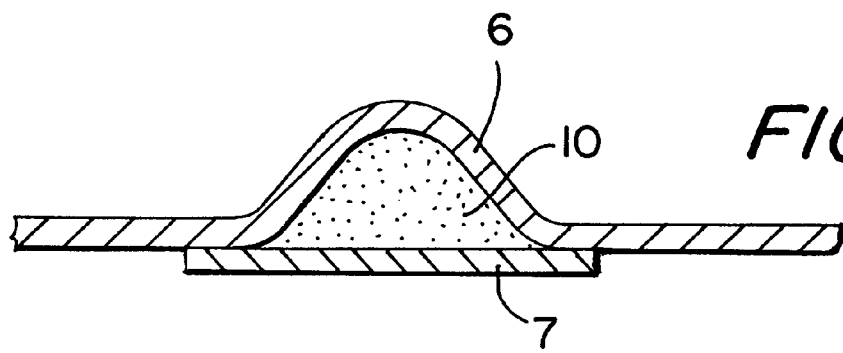
Figure 4B:
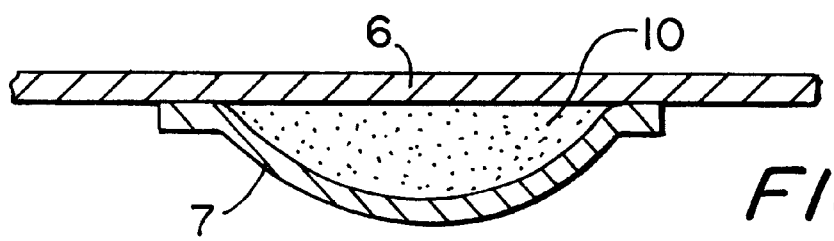
Figure 5:
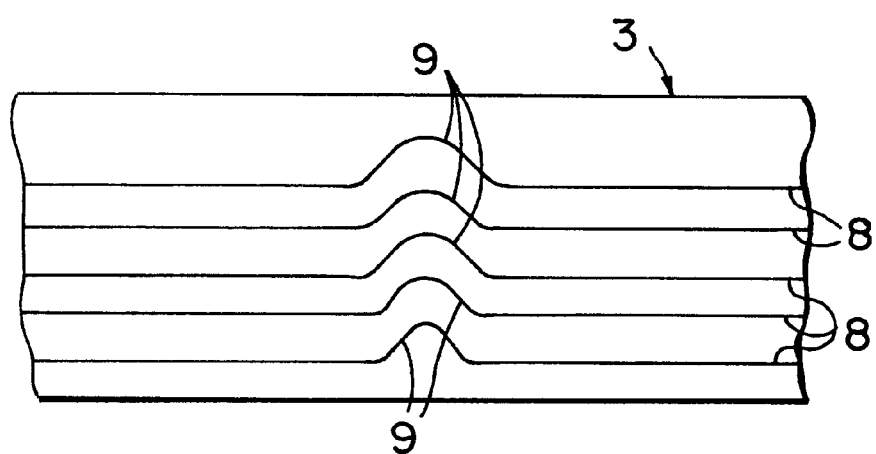

Exemplary embodiments of an exemplary embodiment in accordance with the invention of a flexible strip conductor connection will be explained by means of the drawings. Shown are in:

FIG. 1, a view from above on an angle of rotation sensor in the form of an external component, having a flexible strip conductor connection with parts of a control device arrangement;

FIG. 2, a sectional view of an angle of rotation sensor;

FIG. 3, a plan view of a first exemplary embodiment of a loop in the flexible foil;

FIG. 4, an exemplary embodiment in accordance with FIG. 3 with a filler in the loop and FIG. 5, a plan view of a second exemplary embodiment.

DESCRIPTION OF THE EXEMPLARY EMBODIMENTS

The housing of an angle of rotation sensor 1, portions of a control device 2 and a flexible strip conductor connection 3 are represented in FIG. 1 of the drawings. The angle of rotation sensor is used to detect the angle of rotation of a driveshaft for controlling a fuel injection pump of a motor vehicle, not represented here.

From the sectional representation in FIG. 2 it can be seen that the flexible strip conductor foil 3 is clamped between a cover 4 and a housing 5. The actual angle of rotation encoder, not explained in detail here, in the housing 5 is situated in the area of the fuel injection pump arrangement, and therefore the housing is subjected to the mechanical vibrations of the fuel pump.

An exemplary embodiment of the invention in accordance with FIG. 3 has a buffer in the form of a loop 6 in the course of the flexible strip conductor foil in order to reduce the stretching of the strip conductors in the flexible foil 3 during the shock movements of the fuel pump. The loop 6 can be embossed in the flexible foil 3, or can be formed by means of a bridge 7 of a stretchable material, which is fixed in place at the ends of the loop 6.

In the further development in accordance with FIG. 4, an elastic filler material 10 can be seen in the upper portion which, under normal operating conditions, in the course of a slight tensile strain causes no change in the loop geometry below a predetermined threshold because of the stiffness of the filler material. The loop 6 is straightened only if a greater tensile strain occurs, and a deformation of the bridge 7 including the filler material 10 is caused.

In accordance with a second exemplary embodiment in FIG. 5, the strip conductors 8 are provided with a loop-shaped deflection 9 and embossed with it in the flexible foil 3. In this case the width of the strip conductors 8 preferably is approximately 300 to 700 μm (in particular 400 μm), so that flexibility is assured.

The installation of the above described loops 6 or 9 is not tied to the material (preferably polyamide); the location of the loops should be in the vicinity of the clamping point between the housing 5 and the cover 4 of the angle of rotation sensor 1 (see FIG. 1), in order to absorb the mechanical shocks effectively. In certain applications it is also possible to arrange several loops 6 or 9 one behind the other.

What is claimed is:

1. A device for electrically connecting an electrical device and an external component, the device comprising a flexible foil clampable on the electrical device and on the external component; flexible strip conductors supported by said flexible foil, said flexible foil in a predetermined area in a course of said strip conductors being provided with a portion formed as a loop which is perpendicular in relation to a plane of a remaining portion of said flexible foil and has two spaced end points; and a stretchable material bridging said loop, said stretchable material being fixed in place at said end points of said loop.

2. A device as defined in claim 1, wherein said strip conductors are located in said flexible foil.

3. A device as defined in claim 1, wherein said strip conductors are located on said flexible foil.

4. A device as defined in claim 1, and further comprising an elastic material which fills an area between said loop and said stretchable material.

5. A device as defined in claim 1, wherein said flexible foil is composed of polyamide, said strip conductors being composed of a copper alloy.

6. A device for electrically connecting an electrical device and an external component, the device comprising a flexible foil clampable on the electrical device and on the external component; strip conductors supported by said flexible foil, said strip conductors being provided with a portion which forms a loop-shaped deviation extending perpendicularly to a course of a remaining portion said strip conductors.

7. A device as defined in claim 6, wherein said strip conductors are located in said flexible foil.

8. A device as defined in claim 6, wherein said strip conductors are located on said flexible foil.

9. A device as defined in claim 6, wherein said strip conductors have a width of substantially 300 to 700 μm.

10. A device as defined in claim 6, wherein said flexible foil is composed of polyamide, said strip conductors being composed of a copper alloy.

11. An electrical arrangement; comprising an electrical device; an external component; and means for electrically connecting said electrical device with said external component, said means including a flexible foil clampable on the electrical device and on the external component; flexible strip conductors supported by said flexible foil, said flexible foil in a predetermined area in a course of said strip conductors being provided with a portion formed as a loop which is perpendicular to a plane of a remaining portion of said flexible foil; and a stretchable material bridging said loop, said stretchable material being fixed in place at end points of said loop.

12. An electrical arrangement as defined in claim 11, wherein said external component is a sensor which is subjected to mechanical vibrations, said electrical device being a component of a control device which evaluates a signal of said sensor.

13. An electrical arrangement comprising an electrical device; an external component; and means for electrically connecting said electrical device with said electrical component, said means including a flexible foil clampable on the electrical device and on the external component; strip conductors supported by said flexible foil, said strip conductors being provided with a portion which forms a loop-shaped deviation extending perpendicularly to a course of a remaining portion said strip conductors.

14. An electrical arrangement as defined in claim 13 wherein said external component is a sensor which is subjected to mechanical vibrations, said electrical device being a component of a control device arrangement which evaluates a signal of said sensor.

\* \* \* \* \*